US009117986B2

(12) United States Patent
Choi et al.

(10) Patent No.: US 9,117,986 B2
(45) Date of Patent: *Aug. 25, 2015

(54) LIGHT EMITTING DEVICE

(71) Applicant: LG Innotek Co., Ltd., Seoul (KR)

(72) Inventors: Jeong Hyeon Choi, Seoul (KR); Hyun Kyong Cho, Seoul (KR); Bock Kee Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/150,373

(22) Filed: Jan. 8, 2014

(65) Prior Publication Data
US 2014/0117400 A1 May 1, 2014

Related U.S. Application Data

(63) Continuation of application No. 13/178,975, filed on Jul. 8, 2011, now Pat. No. 8,643,042.

(30) Foreign Application Priority Data

Jul. 12, 2010 (KR) .................. 10-2010-0067114

(51) Int. Cl.
*H01L 33/00* (2010.01)
*H01L 33/60* (2010.01)
(Continued)

(52) U.S. Cl.
CPC .............. *H01L 33/60* (2013.01); *H01L 33/10* (2013.01); *H01L 33/382* (2013.01); *H01L 33/62* (2013.01); *H01L 33/64* (2013.01); *H01L 33/20* (2013.01);
(Continued)

(58) Field of Classification Search
CPC ............................................. H01L 2933/0016
USPC ....................................................... 257/98–100
See application file for complete search history.

(56) References Cited

U.S. PATENT DOCUMENTS 8,643,042 B2 *   2/2014   Choi et al. ...................... 257/98
2002/0117681 A1   8/2002   Weeks et al.
(Continued)

FOREIGN PATENT DOCUMENTS

DE          102008011848    *  9/2009
JP          2009-194109 A       8/2009
(Continued)

OTHER PUBLICATIONS

U.S. Appl. No. 14/150,318.*
(Continued)

*Primary Examiner* — Samuel Gebremariam
(74) *Attorney, Agent, or Firm* — KED & Associates LLP

(57) ABSTRACT

A light emitting device may be provided that includes a conductive support member, a first conductive layer, a second conductive layer, an insulation layer between the first conductive layer and the second conductive layer, and a light emitting structure that includes a second semiconductor layer on the second conductive layer, a first semiconductor layer, and an active layer between the first semiconductor layer and the second semiconductor layer. The first conductive layer may include at least one conductive via that passes through the second conductive layer, the second semiconductor layer and the active layer. A top surface of the at least one conductive via is provided into the first semiconductor layer. The insulation layer may substantially surround a side wall of the conductive via.

17 Claims, 6 Drawing Sheets

(51) Int. Cl.
  *H01L 33/38* (2010.01)
  *H01L 33/64* (2010.01)
  *H01L 33/62* (2010.01)
  *H01L 33/10* (2010.01)
  H01L 33/20 (2010.01)
  H01L 33/22 (2010.01)
  H01L 33/44 (2010.01)

(52) U.S. Cl.
  CPC ............... *H01L 33/22* (2013.01); *H01L 33/44* (2013.01); *H01L 2224/48091* (2013.01); *H01L 2224/48247* (2013.01); *H01L 2933/0016* (2013.01)

(56) References Cited

U.S. PATENT DOCUMENTS

| | | | |
|---|---|---|---|
| 2003/0119218 A1 | 6/2003 | Jang | 438/46 |
| 2008/0035953 A1 | 2/2008 | Beom et al. | 257/103 |
| 2009/0159908 A1 | 6/2009 | David et al. | 257/95 |
| 2010/0096652 A1 | 4/2010 | Choi et al. | 257/98 |
| 2012/0086026 A1* | 4/2012 | Engl et al. | 257/93 |
| 2012/0322186 A1 | 12/2012 | Rode et al. | |

FOREIGN PATENT DOCUMENTS

| | | |
|---|---|---|
| KR | 10-2008-0015192 A | 2/2008 |
| KR | 10-2010-0017365 A | 2/2010 |
| KR | 10-2010-0054756 A | 5/2010 |

OTHER PUBLICATIONS

United States Office Action dated Mar. 28, 2014, issued in U.S. Appl. No. 14/150,318.
European Search Report dated Aug. 29, 2014 issued in Application No. 11173499.2.
P. Kung et al: "III-Nitride wide bandgap semiconductors: a survey of the current status and future trends of the material and device technology", Optoelectronics Review 8(3), 201-239, Dec. 1, 2000, XP055136043, Retrieved from the Internet: URL: http//www.wat.edu.pl/review/optor/2000/3/8(3)201.pdf.
United States Notice of Allowance dated Oct. 2, 2013 issued in U.S. Appl. No. 13/178,975.

* cited by examiner

LIGHT EMITTING DEVICE

CROSS-REFERENCE TO RELATED APPLICATIONS

This application is a Continuation Application of prior U.S. application Ser. No. 13/178,975 filed on Jul. 8, 2011, which claims a priority under 35 U.S.C. §119 to Korean Application No. 10-2010-0067114, filed Jul. 12, 2010, whose entire disclosures are hereby incorporated by reference.

BACKGROUND

1. Field

Embodiments may relate to a light emitting device.

2. Background

A light emitting diode (LED) is a semiconductor element for converting electric energy into light. As compared with existing light sources such as a fluorescent lamp and an incandescent electric lamp, the LED may have advantages of low power consumption, a semi-permanent span of life, a rapid response speed, safety and/or an environmental-friendliness. Research may be devoted to substitution of existing light sources with the LED. The LED may be used as a light source for lighting devices, for example, various lamps used interiorly and exteriorly, a liquid crystal display device, an electric sign and a street lamp and/or the like.

A vertical LED device may be developed that is different from previous LED devices and may have upper and lower electrodes formed therein. In the vertical LED device, since electric current flows from top to bottom, the electric current may be uniformly injected and distributed throughout an entire area of the device. Therefore, the vertical LED device may have a low operating voltage and an excellent current uniformity in an active area.

When the vertical LED device is applied to a high-power application such as a display, an inner/outer lighting module and a lighting and the like, thermal properties may be improved and a design suitable for the thermal properties may be developed. The vertical LED device may have advantages of removing a sapphire substrate having a low thermal conductivity, of improving thermal resistance by inserting a metallic electrode, and/or of increasing product life span.

BRIEF DESCRIPTION OF THE DRAWINGS

Arrangements and embodiments may be described in detail with reference to the following drawings in which like reference numerals refer to like elements and wherein.

DETAILED DESCRIPTION

Embodiments may be described in detail with reference to accompanying drawings. However, the accompanied drawings are provided only for more easily describing the embodiments. It may be understood by those skilled in the art that the spirit and scope of embodiments is not limited to the scope of the accompanied drawings.

A thickness or a size of each layer may be magnified, omitted or schematically shown for the purpose of convenience and clearness of description. The size of each component does not necessarily mean its actual size.

It will be understood that when an element is referred to as being 'on' or 'under' another element, it may be directly on/under the element, and one or more intervening elements may also be present. When an element is referred to as being 'on' or 'under', 'under the element' as well as 'on the element' may be included based on the element.

An embodiment may be described in detail with reference to the accompanying drawings.

First Embodiment

Figure 1A:
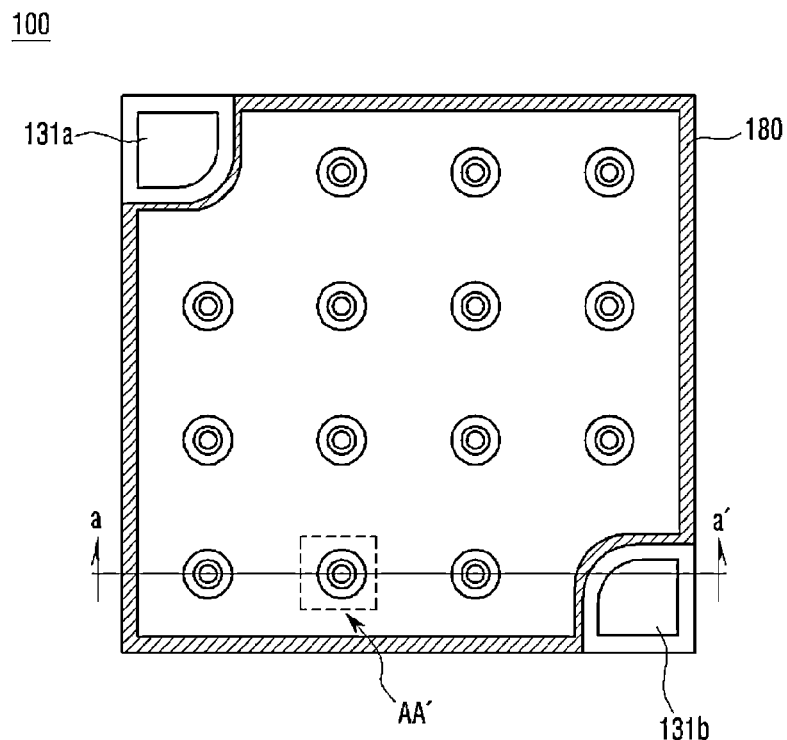
FIG. 1A shows a top surface of a light emitting device according to a first embodiment.
Figure 1B:
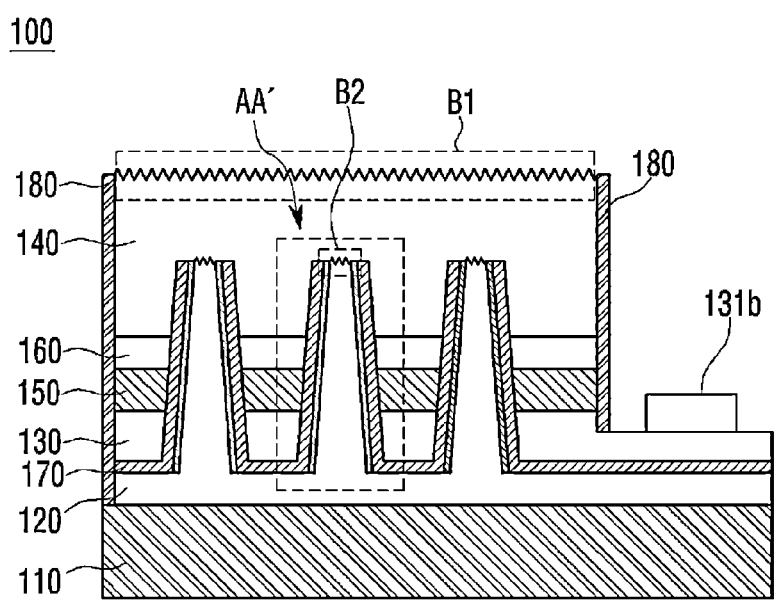
FIG. 1B is a cross-sectional view of the light emitting device taken along a line a-a' shown in FIG. 1A.
Figure 1C:
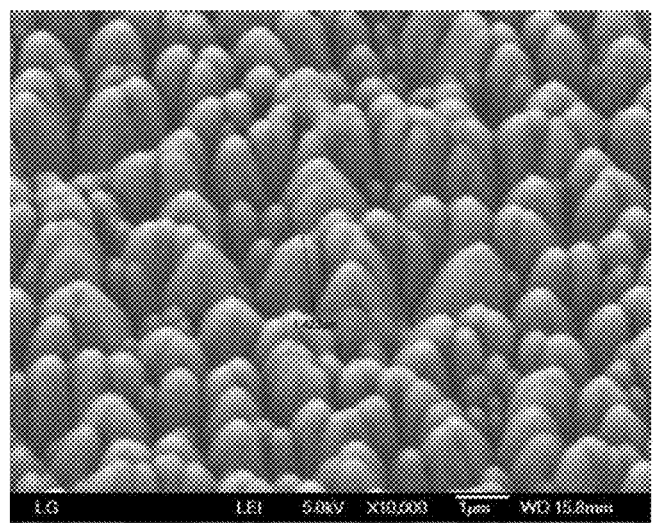
FIG. 1C is an electron microscope photograph enlarging the 'B1' area shown in FIG. 1B.
Figure 1D:
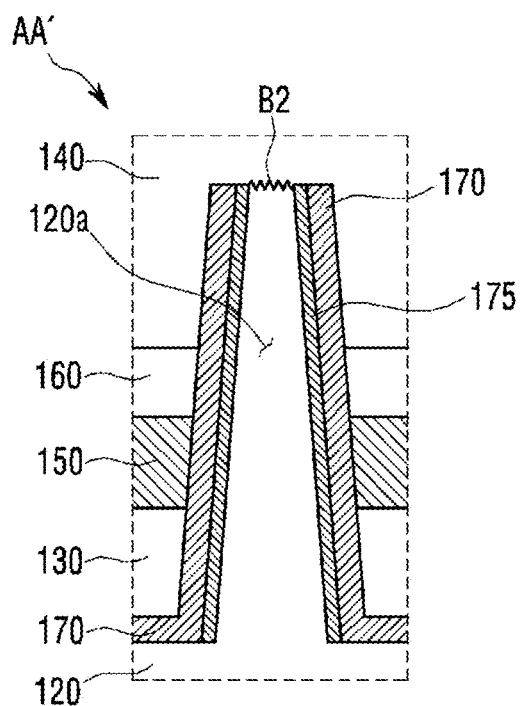
FIG. 1D is a view enlarging the AA' area shown in FIG. 1B.

FIG. 1A shows a top surface of a light emitting device 100 according to a first embodiment. FIG. 1B is a cross-sectional view of the light emitting device 100 taken along a line a-a' shown in FIG. 1A. FIG. 1C is an electron microscope photograph enlarging the 'B1' area shown in FIG. 1B. FIG. 1D is a view enlarging the AA' area shown in FIG. 1B. Other embodiments and configurations may also be provided.

Referring to FIGS. 1A, 1B and 1D, the light emitting device 100 according may include a conductive support member 110, a first conductive layer 120, a second conductive layer 130, an insulation layer 170 disposed between the first conductive layer 10 and the second conductive layer 130, and a light emitting structure.

The conductive support member 110 may include at least one of Au, Ni, Al, Cu, W, Si, Se or GaAs. For example, the conductive support member 110 may be made of a metal alloy of Si and Al.

The light emitting structure may include a first semiconductor layer 140, a second semiconductor layer 150 and an active layer 160 disposed between the first semiconductor layer 140 and the second semiconductor layer 150.

For ease of convenience, it is assumed that the first conductive layer 120 is an n-type conductive layer, the second conductive layer 130 is a p-type conductive layer, the first semiconductor layer 140 is an n-type semiconductor layer, and the second semiconductor layer 150 is a p-type semiconductor layer.

The n-type conductive layer 120 may be formed on the conductive support member 110 and may include at least one conductive via 120a that has an inclined slope. The n-type conductive layer 120 may include at least one of Al, Au, Pt, Ti, Cr or W.

The conductive via 120a may pass (or penetrate) through the p-type conductive layer 130, the p-type semiconductor layer 150 and the active layer 160 from the n-type conductive layer 120, and pass (or project) into the n-type semiconductor layer 140. That is, the n-type conductive layer 120 may pass (or penetrate) through the p-type conductive layer 130, the p-type semiconductor layer 150 and the active layer 160 and may include the conductive via 120a disposed in the n-type semiconductor layer 140. A top surface (or first surface) of the conductive via 120a may contact the n-type semiconductor layer 140. Accordingly, the conductive support member 110 may be electrically connected to the n-type semiconductor layer 140 through the conductive via 120a of the n-type conductive layer 120. Since the n-type conductive layer 120 is electrically connected to the conductive support member 110 and the n-type semiconductor layer 140, the n-type conductive layer 120 may be constituted by a material having a minimum contact resistance with the conductive support member 110 and the n-type semiconductor layer 140.

As shown in FIG. 1C, the top surface B1 of the n-type semiconductor layer 140 and at least a portion of the top surface B2 of the conductive via 120a contacting directly with the n-type semiconductor layer 140 may respectively have a surface roughness. The surface roughness may have a cycle in a micro unit. However, the cycle is not limited to this. The surface roughness may be non-uniformly formed. Since the top surface B2 of the conductive via 120a is formed to have the surface roughness, an ohmic contact surface of the n-type semiconductor layer 140 may have the surface roughness.

As such, the contact resistance may be reduced due to the surface area increase caused by the surface roughness of the ohmic contact surface and the surface roughness of the top surface B2 of the conductive via 120a. Therefore, the ohmic contact characteristics of the light emitting device 100 may be improved.

In the surface roughness of the top surface B1 of the n-type semiconductor layer 140 and the surface roughness of the top surface B2 of the conductive via 120a, the roughness of the surface may change a critical angle of light and allow the light to be easily extracted so that the light-extraction efficiency of the light emitting device 100 may be improved.

A reflective layer 175 may be provided on an inner surface of the conductive via 120a in such a manner as to surround the conductive via 120a. The reflective layer 175 may be formed by including at least one of Ag, Al, Pt, Ni, Pt, Pd, Au, Ir or a transparent conductive oxide. The transparent conductive oxide may include ITO and GZO. The reflective layer 175 may be formed on a lateral surface of the conductive via 120a, and may then improve the light-extraction efficiency of an electrode of the conductive via 120a.

The insulation layer 170 may be formed such that the n-type conductive layer 120 is electrically insulated from layers other than the conductive support member 110 and the n-type semiconductor layer 140. More specifically, the insulation layer 170 is formed between the n-type conductive layer 120 and the p-type conductive layer 130 and on the reflective layer 175, so that the n-type conductive layer 120 is electrically insulated from the p-type conductive layer 130, the p-type semiconductor layer 150 and the active layer 160. That is, the insulation layer 170 between the n-type conductive layer 120 and the p-type conductive layer 130 may be formed extending to the side wall of the conductive via 120a. The insulation layer 170 may be formed to include at least one of silicon oxide ($SiO_2$), silicon nitride ($SiO_xN_y$, $Si_xN_y$), metal oxide ($Al_2O_3$) or fluoride based compound.

The p-type conductive layer 130 is formed on the insulation layer 170. The p-type conductive layer 130 may not be present in some areas through which the via electrode area B1 penetrates. The p-type conductive layer 130 may be formed to include at least one of Ag, Al, Pt, Ni, Pt, Pd, Au, Ir or a transparent conductive oxide (ITO and GZO). Through this, since the p-type conductive layer 130 electrically contacts with the p-type semiconductor layer 150, not only the contact resistance of the p-type semiconductor layer 150 is mini-mized but also light emission efficiency is improved by reflecting outwardly light generated from the active layer 160.

The p-type conductive layer 130 may include at least one exposed area of the interface on which the p-type conductive layer 130 contacts the p-type semiconductor layer 150. P-type electrode pads 131a and 131b may be formed on the exposed area in order to connect an external power supply to the p-type conductive layer 130. The p-type semiconductor layer 150, the active layer 160 and the n-type semiconductor layer 140 may not be formed on the exposed area. The p-type electrode pads 131a and 131b may be formed in a corner of the light emitting device 100, so that the light emitting area of the light emitting device 100 can be maximized.

The active layer 160 exposed outward may function as a current leakage path during operation of the light emitting device 100. Such a problem may be prevented by forming a passivation layer 180 on a side wall of the light emitting structure. The passivation layer 180 may protect the light emitting structure, especially the active layer 160 from the outside and prevent a leakage current from flowing. The passivation layer 180 may be formed to include at least one of silicon oxide ($SiO_2$), silicon nitride ($SiO_xN_y$, $Si_xN_y$), metal oxide ($Al_2O_3$) or fluoride based compound.

The p-type semiconductor layer 150 is formed on the p-type conductive layer 130. The active layer 160 is formed on the p-type semiconductor layer 150. The n-type semiconductor layer 140 is formed on the active layer 160.

The n-type semiconductor layer 140 is formed of a semiconductor material having an empirical formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN and InN and the like. An n-type dopant such as Si, Ge and Sn and/or the like may be doped on the n-type semiconductor layer 140.

The p-type semiconductor layer 150 may be formed of a semiconductor material having an empirical formula of $In_xAl_yGa_{1-x-y}N$ ($0 \leq x1$, $0 \leq y \leq 1$, $0 \leq x+y \leq 1$), for example, InAlGaN, GaN, AlGaN, InGaN, AlInN, AlN and InN and/or the like. A p-type dopant such as Mg and Zn and/or the like may be doped on the p-type semiconductor layer 150.

The active layer 160 is formed of a semiconductor material having an empirical formula of $In_xAl_yGa_{1-x-y}N$ ($0 \leq x \leq 1$, $0 \leq y \leq 1$, $0 \leq x+y \leq 1$). When the active layer 160 is formed in a multiple quantum well (MQW) structure, the active layer 160 may be formed by stacking a plurality of well layers and a plurality of barrier layers, for example, at a cycle of InGaN well layer/GaN barrier layer.

The active layer 160 may be formed of another material in accordance with the material constituting the n-type semiconductor layer 140 and the p-type semiconductor layer 150. In other words, the active layer 160 may convert energy by recombination of electrons and holes into light. Therefore, the active layer 160 may be formed of a material having an energy band gap smaller than those of the n-type semiconductor layer 140 and the p-type semiconductor layer 150.

Second Embodiment

Figure 2A:
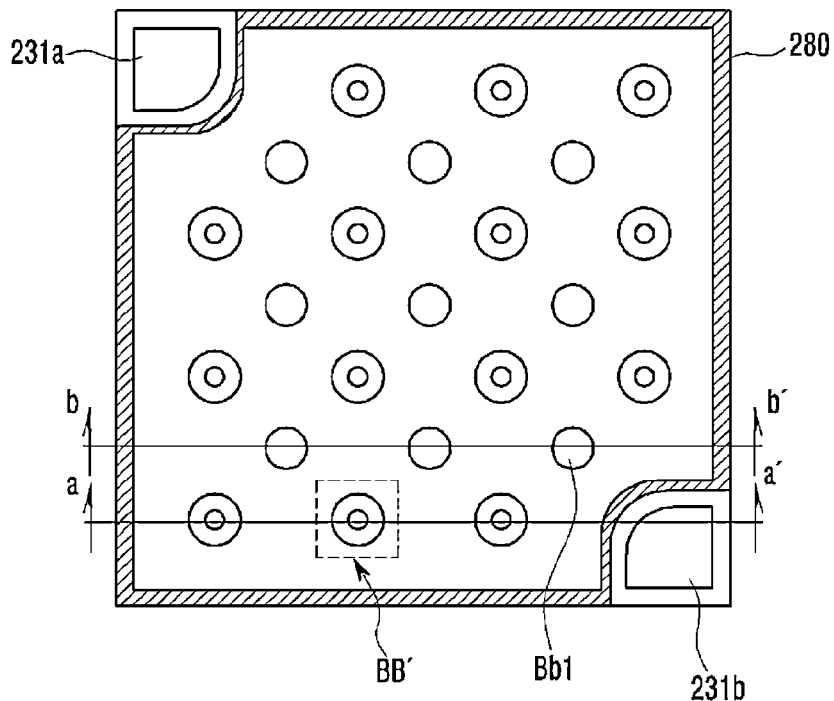
FIG. 2A shows a top surface of a light emitting device according to a second embodiment.
Figure 2B:
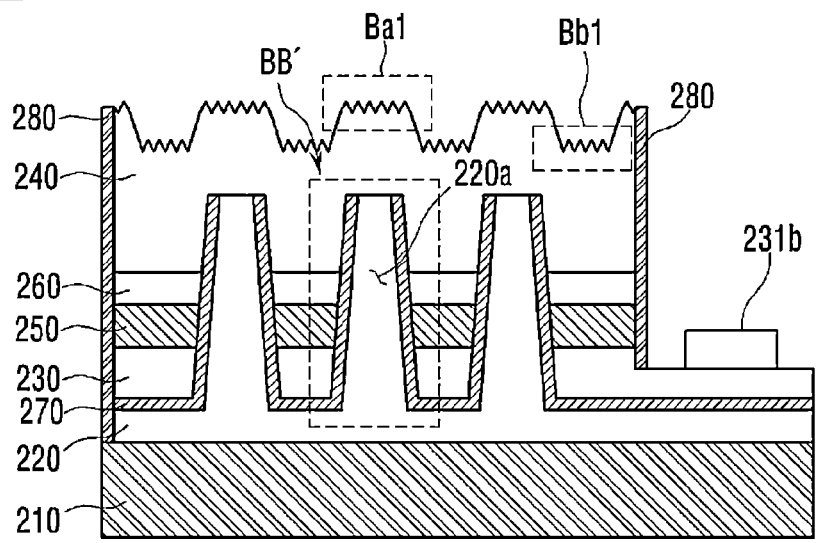
FIG. 2B shows cross-sections of the light emitting device taken along lines a-a' and b-b' shown in FIG. 2A.

FIG. 2A shows a top surface of a light emitting device 200 according to a second embodiment. FIG. 2B shows cross-sections of the light emitting device 200 that are taken along lines a-a' and b-b' shown in FIG. 2A. For the purpose of understanding the sectional structure of the light emitting device 200, FIG. 2B shows not only the sectional structure of the light emitting device 200 taken along the line a-a' but also the sectional structure of a recess Bb1 (or etching hole) taken along the line b-b'.

Referring to FIGS. 2A and 2B, the light emitting device 200 may include a conductive support member 210, a first conductive layer 220, a second conductive layer 230, an insulation layer 270 between the first conductive layer 220 and the second conductive layer 230, and a light emitting structure.

The conductive support member 210 may be formed to include at least one of Au, Ni, Al, Cu, W, Si, Se or GaAs. For example, the conductive support member 210 may be made of a metal alloy of Si or Al.

The light emitting structure may include a first semiconductor layer 240, a second semiconductor layer 250 and an active layer 260 between the first semiconductor layer 240 and the second semiconductor layer 250.

For ease of description, it is assumed that the first conductive layer 220 is an n-type conductive layer, the second conductive layer 230 is a p-type conductive layer, the first semiconductor layer 240 is an n-type semiconductor layer, and the second semiconductor layer 250 is a p-type semiconductor layer.

The n-type conductive layer 220 may be formed on the conductive support member 210 and may include at least one conductive via 220a. The n-type conductive layer 220 may be formed to include at least one of Al, Au, Pt, Ti, Cr or W.

The conductive via 220a may pass (or penetrate) through the p-type conductive layer 230, the p-type semiconductor layer 250 and the active layer 260 from the n-type conductive layer 220, and pass (or project) into a certain area of the n-type semiconductor layer 240. That is, the n-type conductive layer 220 may pass (or penetrate) through the p-type conductive layer 230, the p-type semiconductor layer 250 and the active layer 260 and may include the conductive via 220a disposed in the n-type semiconductor layer 240. A top surface (or first surface) of the conductive via 220a may contact the n-type semiconductor layer 240. The conductive via 220a may have inclined side walls. Accordingly, the conductive support member 210 may be electrically connected to the n-type semiconductor layer 240 through the n-type conductive layer 220. Since the n-type conductive layer 220 may be electrically connected to the conductive support member 210 and the n-type semiconductor layer 240, the n-type conductive layer 220 may be constituted by a material having a minimum contact resistance with the conductive support member 210 and the n-type semiconductor layer 240. As described in the first embodiment, a reflective layer may be provided on an inner surface of the conductive via 220a so as to surround the conductive via 220a.

The insulation layer 270 may be formed such that the n-type conductive layer 220 may be electrically insulated from layers other than the conductive support member 210 and the n-type semiconductor layer 240. More specifically, the insulation layer 270 may be formed between the n-type conductive layer 220 and the p-type conductive layer 230 and on the side wall of the conductive via 220a, so that the n-type conductive layer 220 is electrically insulated from the p-type conductive layer 230, the p-type semiconductor layer 250 and the active layer 260. That is, the insulation layer 270 provided between the n-type conductive layer 220 and the p-type conductive layer 230 may extend to the side wall of the conductive via 220a. The insulation layer 270 may be formed to include at least one of silicon oxide ($SiO_2$), silicon nitride ($SiO_xN_y$, $Si_xN_y$), metal oxide ($Al_2O_3$) or fluoride based compound. The insulation layer 170 may substantially surround a side wall of the conductive via 220a.

The p-type conductive layer 230 may be formed on the insulation layer 270. The p-type conductive layer 230 may not be present in some areas through which the conductive via 220a passes (or penetrates). The p-type conductive layer 230 may be formed to include at least one of Ag, Al, Pt, Ni, Pt, Pd, Au, Ir or a transparent conductive oxide (ITO and GZO). Since the p-type conductive layer 230 electrically contacts with the p-type semiconductor layer 250, not only the contact resistance of the p-type semiconductor layer 250 is minimized but also light emission efficiency may be improved by reflecting outwardly light generated from the active layer 260.

The p-type conductive layer 230 may include at least one exposed area of the interface on which the p-type conductive layer 230 contacts the p-type semiconductor layer 250. P-type electrode pads 231a and 231b may be formed on the exposed area in order to connect an external power supply to the p-type conductive layer 230. The p-type semiconductor layer 250, the active layer 260 and the n-type semiconductor layer 240 are not formed on the exposed area. The p-type electrode pads 231a and 231b can be formed in a corner of the light emitting device 200, so that the light emitting area of the light emitting device 200 can be maximized.

The active layer 260 exposed outward may function as a current leakage path during operation of the light emitting device 200. Such a problem may be prevented by forming a passivation layer 280 on the side wall of the light emitting structure. The passivation layer 280 may protect the light emitting structure, and especially the active layer 260, from the outside and prevent a leakage current from flowing. The passivation layer 280 may be formed to include at least any one of silicon oxide ($SiO_2$), silicon nitride ($SiO_xN_y$, $Si_xN_y$), metal oxide ($Al_2O_3$) or fluoride based compound.

At least a portion of the top surface Ba1 of the n-type semiconductor layer 240 may have a surface roughness in a micro unit. At least a part of the upper portion of the n-type semiconductor layer 240 may include at least one recess Bb1 (or etching hole) formed therein. The bottom surface of the recess Bb1 may have the surface roughness in a micro unit. As shown in FIG. 2A, the recess Bb1 may be provided between a conductive via electrode BB' and an electrode. The surface roughness may be a roughness structure. The roughness structure may be provided on at least a portion of the top surface of the first semiconductor layer and the bottom surface of the recess Bb1.

A top surface of the semiconductor layer 240 may include a first surface area and a second surface area each having a surface roughness. A recess may be provided between the first surface area and the second surface area, and may have a bottom surface that has a surface roughness.

The surface roughness of the top surface Ba1 of the n-type semiconductor layer 240, the surface roughness of the bottom surface Bb1 of the recess Bb1, and the structure itself of the recess Bb1 may change the critical angle of light and allow the light to be easily extracted, so that the light-extraction efficiency of the light emitting device 200 may be improved. The recess Bb1 may be uniformly arranged between the conductive via electrodes BB' and electrodes, and then light may be more uniformly emitted.

The p-type semiconductor layer 250 is formed on the p-type conductive layer 230. The active layer 260 is formed on the p-type semiconductor layer 250. The n-type semiconductor layer 240 is formed on the active layer 260.

The n-type semiconductor layer 240 is formed of a semiconductor material having an empirical formula of $In_xAl_yGa_{1-x-y}N$ ($0 \le x \le 1$, $0 \le y \le 1$, $0 \le x+y \le 1$), for example, InAlGaN, GaN, AlGaN, InGaN, AlInN, AlN and InN and/or the like. An n-type dopant such as Si, Ge and Sn and/or the like may be doped on the n-type semiconductor layer 240.

The p-type semiconductor layer 250 may be formed of a semiconductor material having an empirical formula of $In_xAl_yGa_{1-x-y}N$ ($0 \le x \le 1$, $0 \le y \le 1$, $0 x+ \le 1$), for example, InAlGaN, GaN, AlGaN, InGaN, AlInN, AlN and InN and/or the like. A p-type dopant such as Mg and Zn and/or the like may be doped on the p-type semiconductor layer 250.

The active layer 260 may be formed in any one of a single quantum well structure, a multiple quantum well (MQW) structure, a quantum wire structure and/or a quantum dot structure. The structure of the active layer 260 is not limited to this.

The active layer 260 may be formed of a semiconductor material having an empirical formula of $In_xAl_yGa_{1-x-y}N$ (0≤x≤1, 0≤y≤1, 0≤x+y≤1). When the active layer 260 is formed in the multiple quantum well (MQW) structure, the active layer 260 is formed by stacking a plurality of well layers and a plurality of barrier layers, for example, at a cycle of InGaN well layer/GaN barrier layer.

The active layer 260 may be formed of another material in accordance with the material constituting the n-type semiconductor layer 240 and the p-type semiconductor layer 250. In other words, the active layer 260 may convert energy by recombination of electrons and holes into light. Therefore, the active layer 260 may be formed of a material having an energy band gap smaller than those of the n-type semiconductor layer 240 and the p-type semiconductor layer 250.

Third Embodiment

Figure 3A:
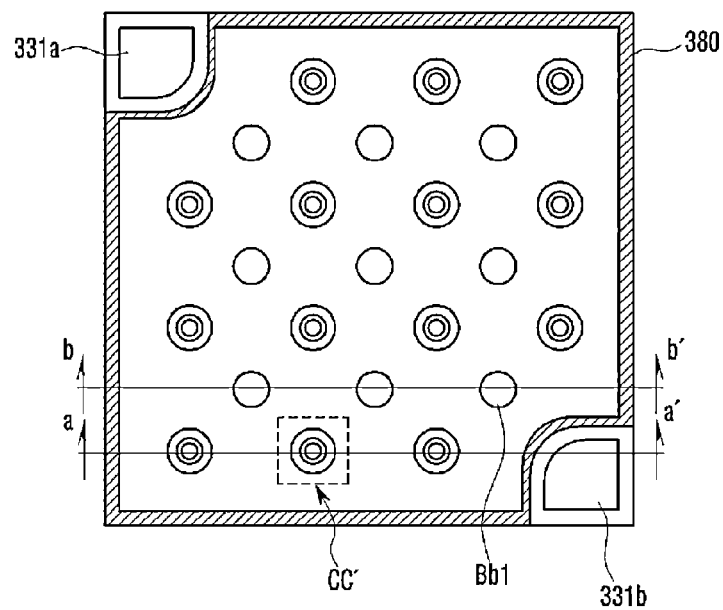
FIG. 3A shows a top surface of a light emitting device according to a third embodiment.
Figure 3B:
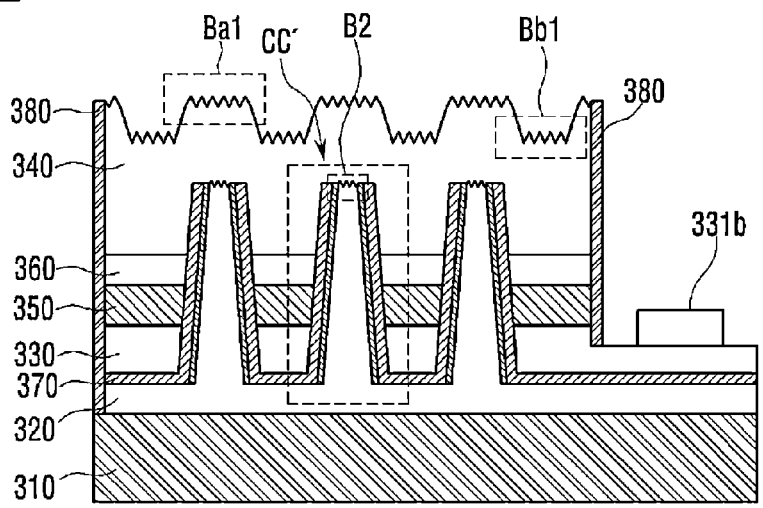
FIG. 3B shows cross-sections of the light emitting device taken along lines a-a' and b-b' shown in FIG. 3A.
Figure 3C:
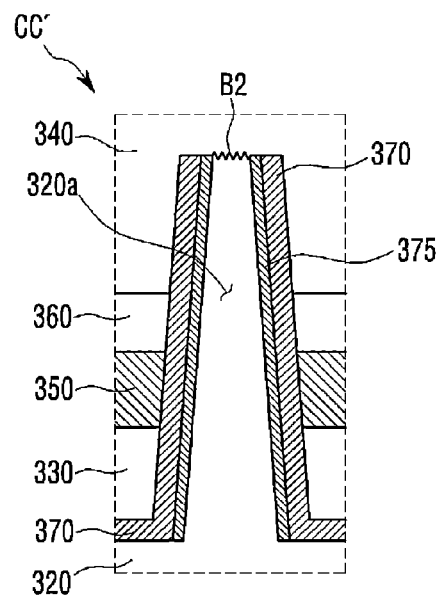
FIG. 3C is a view enlarging the CC' area shown in FIG. 3B.

FIG. 3A shows a top surface of a light emitting device 300 according to a third embodiment. FIG. 3B shows cross-sections of the light emitting device 300 taken along lines a-a' and b-b' shown in FIG. 3A. For the purpose of understanding the sectional structure of the light emitting device 300, FIG. 3B shows not only the sectional structure of the light emitting device 300 taken along the line a-a' but also the sectional structure of a recess Bb2 taken along the line b-b'. FIG. 3C is a view enlarging the CC' area shown in FIG. 3B. Other embodiments and configurations may also be provided.

Referring to FIGS. 3A, 3B and 3C, the light emitting device 300 may include a conductive support member 310, a first conductive layer 320, a second conductive layer 330, an insulation layer 370 disposed between the first conductive layer 320 and the second conductive layer 330, and a light emitting structure.

The conductive support member 310 may be formed to include at least one of Au, Ni, Al, Cu, W, Si, Se or GaAs. For example, the conductive support member 310 may be made of a metal alloy of Si and Al.

The light emitting structure may include a first semiconductor layer 340, a second semiconductor layer 350 and an active layer 360 between the first semiconductor layer 340 and the second semiconductor layer 350. For ease of description, it is assumed that the first conductive layer 320 is an n-type conductive layer, the second conductive layer 330 is a p-type conductive layer, the first semiconductor layer 340 is an n-type semiconductor layer, and the second semiconductor layer 350 is a p-type semiconductor layer.

The n-type conductive layer 320 may be formed on the conductive support member 310 and may include at least one conductive via 320a that has an inclined slope. The n-type conductive layer 320 may be formed to include at least one of Al, Au, Pt, Ti, Cr or W.

The conductive via 320a may pass (or penetrate) through the p-type conductive layer 330, the p-type semiconductor layer 350 and the active layer 360 from the n-type conductive layer 320, and may pass (or project) into the certain area of the n-type semiconductor layer 340. That is, the n-type conductive layer 320 may pass through the p-type conductive layer 330, the p-type semiconductor layer 350 and the active layer 360 and may include the conductive via 320a disposed in the n-type semiconductor layer 340. A top surface (or first surface) of the conductive via 320a may contact the n-type semiconductor layer 340. Accordingly, the conductive support member 310 may be electrically connected to the n-type semiconductor layer 340 through the n-type conductive layer 320. Since the n-type conductive layer 320 is electrically connected to the conductive support member 310 and the n-type semiconductor layer 340, the n-type conductive layer 320 may be constituted by a material having a minimum contact resistance with the conductive support member 310 and the n-type semiconductor layer 340.

A portion of the top surface Ba2 of the conductive via 320a directly contacting with the n-type semiconductor layer 340 may have a surface roughness in a micro unit. Since the portion of the top surface B2 of the conductive via 320a is formed to have the surface roughness, an ohmic contact surface of the n-type semiconductor layer 340 may have the surface roughness.

The contact resistance may be reduced due to the surface area increase caused by the surface roughness of the ohmic contact surface and the surface roughness of the top surface B2 of the conductive via 320a. Therefore, the ohmic contact characteristics of the light emitting device 300 may be improved.

A first surface area and a second surface area of the top surface Ba1 of the n-type semiconductor layer 340 may have a surface roughness in a micro unit. The upper portion of the n-type semiconductor layer 340 may include at least recess Bb1 (or etching hole) formed therein. The recess Bb1 may be provided between the first surface area and the second surface area. The bottom surface of the recess Bb1 may also have the surface roughness in a micro unit. As shown in FIG. 3A, the recess Bb1 is provided between a conductive via electrode CC' and an electrode.

The surface roughness of the top surface Ba1 of the n-type semiconductor layer 340, the surface roughness of the bottom surface of the recess Bb1, the surface roughness of the top surface B2 of the conductive via 320a, and the structure itself of the recess Bb1 may change the critical angle of light and allow the light to be easily extracted, so that the light-extraction efficiency of the light emitting device 300 can be improved. The recesses Bb1 may be uniformly arranged between the conductive via electrodes CC' and electrodes, and then light may be more uniformly emitted.

A reflective layer 375 may be provided on the inner surface of the conductive via 320a in such a manner as to surround the conductive via 320a. The reflective layer 375 may be formed to include at least one of Ag, Al, Pt, Ni, Pt, Pd, Au, Ir or a transparent conductive oxide. The transparent conductive oxide may include ITO and GZO. The reflective layer 375 may be formed on a lateral surface of the conductive via 320a, and may then improve the light-extraction efficiency of an electrode of the conductive via 320a.

The insulation layer 370 may be formed such that the n-type conductive layer 320 is electrically insulated from layers other than the conductive support member 310 and the n-type semiconductor layer 340. More specifically, the insulation layer 370 may be formed between the n-type conductive layer 320 and the p-type conductive layer 330 and on the reflective layer 375 so that the n-type conductive layer 320 is electrically insulated from the p-type conductive layer 330, the p-type semiconductor layer 350 and the active layer 360. That is, the insulation layer 370 between the n-type conductive layer 320 and the p-type conductive layer 330 may be formed extending to the side wall of the conductive via 320a. Such an insulation layer 370 may be formed to include at least any one of silicon oxide ($SiO_2$), silicon nitride ($SiO_xN_y$, $Si_xN_y$), metal oxide ($Al_2O_3$) or fluoride based compound.

The p-type conductive layer 330 is formed on the insulation layer 370. The p-type conductive layer 330 may not be present in some areas through which the via electrode area B1 passes. The p-type conductive layer 330 may be formed to include at least one of Ag, Al, Pt, Ni, Pt, Pd, Au, Ir or a transparent conductive oxide (ITO and GZO). Since the p-type conductive layer 330 electrically contacts the p-type semiconductor layer 350, not only the contact resistance of the p-type semiconductor layer 350 is minimized but also light emission efficiency is improved by reflecting outwardly light generated from the active layer 360.

The p-type conductive layer 330 may include at least one exposed area of the interface on which the p-type conductive layer 330 contacts the p-type semiconductor layer 350. P-type electrode pads 331a and 331b may be formed on the exposed area in order to connect an external power supply to the p-type conductive layer 330. The p-type semiconductor layer 350, the active layer 360 and the n-type semiconductor layer 340 are not formed on the exposed area. The p-type electrode pads 331a and 331b may be formed in a corner of the light emitting device 300, so that the light emitting area of the light emitting device 300 may be maximized.

The active layer 360 may be exposed outward to function as a current leakage path during operation of the light emitting device 300. Such a problem may be prevented by forming a passivation layer 380 on the side wall of the light emitting structure. The passivation layer 380 may protect the light emitting structure, and especially the active layer 360, from the outside, and may prevent a leakage current from flowing. The passivation layer 380 may be formed to include at least one of silicon oxide ($SiO_2$), silicon nitride ($SiO_xN_y$, $Si_xN_y$), metal oxide ($Al_2O_3$) or fluoride based compound.

The p-type semiconductor layer 350 is formed on the p-type conductive layer 330. The active layer 360 is formed on the p-type semiconductor layer 350. The n-type semiconductor layer 340 is formed on the active layer 160.

The active layer 360 may be formed of another material in accordance with the material constituting the n-type semiconductor layer 340 and the p-type semiconductor layer 350. The active layer 360 may convert energy by recombination of electrons and holes into light. Therefore, the active layer 360 may be formed of a material having an energy band gap smaller than those of the n-type semiconductor layer 340 and the p-type semiconductor layer 350.

According to the embodiment, due to the surface roughness of the top surface of the n-type semiconductor layer 340, the surface roughness of the bottom surface of the recess Bb1, the surface roughness of the top surface of the conductive via 320a, the light-extraction efficiency by photon scattering may be improved.

The size and the depth of the recess Bb1 may be variously determined according to arrangement of the conductive via 320a and thickness of the n-type semiconductor layer 340. The diameter of the bottom surface of the recess Bb1 may be formed to be equal to or larger than 5 um and equal to or less than 50 μm. The depth of the recess Bb1 may be formed to be ⅓ to ½ of a thickness of the n-type semiconductor layer 340. The thickness of the n-type semiconductor layer 340 may be measured in a portion (i.e., the first surface area or the second surface area) having no recess (or etching hole) formed therein and may extend from the surface of the active layer 360 to the surface of the n-type semiconductor layer 340. The reflective layer formed on a lateral surface of the conductive via 320a may improve the light-extraction efficiency.

The ohmic contact characteristics may be more improved due to the surface area increase caused by the surface roughness of the ohmic contact surface and the surface roughness of the top surface of the conductive via 320a.

Light Emitting Device Package

Figure 4:
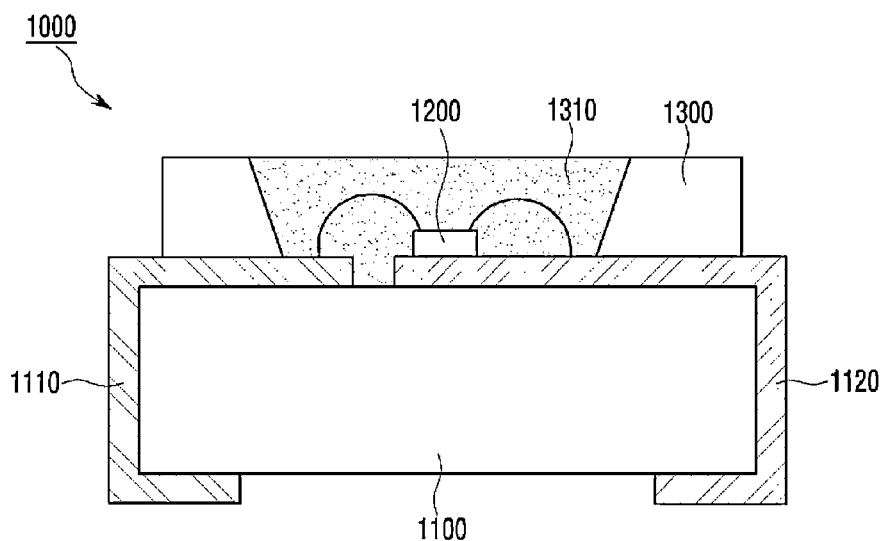
FIG. 4 shows a light emitting device package.

A light emitting device package according to an embodiment may be described with reference to FIG. 4. FIG. 4 shows a light emitting device package 1000.

As shown in FIG. 4, the light emitting device package 1000 may include a package body 1100, a first electrode 1110, a second electrode 1120, a light emitting device 1200 and a filler 1300.

The package body 1100 may be formed to include a silicon material, a synthetic resin material or a metallic material. Inclined surfaces may be formed around the light emitting device 1200, thereby improving the light-extraction efficiency.

The first electrode 1110 and the second electrode 1120 may be provided in the package body 1100. The first electrode 1110 and the second electrode 1120 may be electrically isolated from each other and may supply electric power to the light emitting device 1200. The first electrode 1110 and the second electrode 1120 may reflect light generated from the light emitting device 1200 and increase luminous efficiency. The first electrode 1110 and the second electrode 1120 may also exhaust heat generated from the light emitting device 1200.

The light emitting device 1200 may be electrically connected to the first electrode 1110 and the second electrode 1120. The light emitting device 1200 may be provided on the package body 1100 or may be provided on either the first electrode 1110 or the second electrode 1120.

The light emitting device 1200 may also be electrically connected to the first electrode 1110 and the second electrode 1120 in a wire bonding manner or in a flip-chip manner and in a die-bonding process.

The filler 1300 may be formed to surround and protect the light emitting device 1200. The filler 1300 may include a fluorescent material and may change the wavelength of light emitted from the light emitting device 1200.

The light emitting device package 1000 may be equipped with one or a plurality of the light emitting devices disclosed in the above embodiments. There is no limited to the number of the light emitting devices.

A plurality of the light emitting device packages 1000 may be arrayed on the support member. An optical member (such as a light guide plate, a prism sheet and a diffusion sheet and/or the like) may be provided on the optical path of the light emitting device package 1000. Such a light emitting device package 1000, the support member and the optical member may function as a light unit.

Another embodiment may be implemented by a display device, a pointing device, a backlight unit, a lighting device and/or the like, all of which may include the semiconductor light emitting device or the light emitting device package that has been described in the aforementioned embodiments. For example, the lighting device may include a lamp and a street lamp.

Lighting Device

Figure 5:
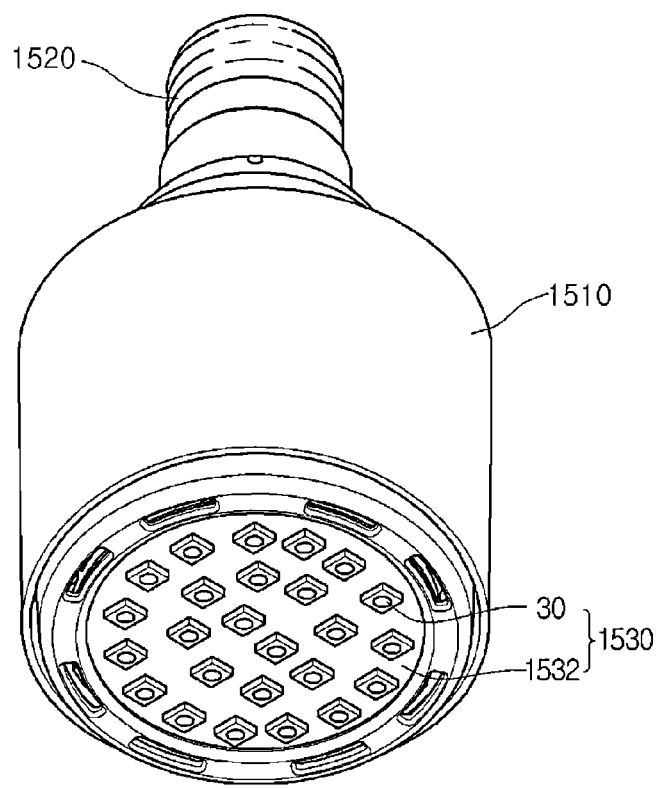
FIG. 5 is a view showing a lighting system including the light emitting device package.

FIG. 5 is a view showing a lighting system 1500 that includes the light emitting device package according to the aforementioned embodiment.

Referring to FIG. 5, the lighting system 1500 may include a case 1510, a light emitting module 1530 disposed in the case 1510, and a connection terminal 1520 disposed in the case 1510 and supplied with an electric power from an external power supply.

The case 1510 may be formed of a material having an excellent heat radiating characteristic, for example, a metal material or a resin material.

The light emitting module 1530 may include a board 1532 and at least one light emitting device package 30 that is based on an above embodiment and is mounted on the board 1532. The light emitting device package 30 may include a plurality of light emitting devices that are arranged apart from each other at a predetermined interval in the form of a matrix.

The board 1532 may be an insulating substrate on which a circuit pattern has been printed, and may include, for example, a printed circuit board (PCB), a metal core PCB, a flexible PCB, a ceramic PCB, an FR-4 substrate, etc.

The board 1532 may be formed of a material capable of efficiently reflecting light. The surface of the board 1532 may have a color capable of efficiently reflecting light, such as white or silver.

The at least one light emitting device package 30 may be provided on the board 1532. Each of the light emitting device packages 30 may include at least one light emitting diode (LED) chip. The LED chip may include both a LED emitting red, green, blue or white light and a UV LED emitting ultraviolet (UV).

The light emitting module 1530 may have various combinations of the light emitting device packages so as to obtain a desired color and luminance. For example, the light emitting module 1530 may have a combination of a white LED, a red LED and a green LED in order to obtain a high color rendering index (CRI).

The connection terminal 1520 may be electrically connected to the light emitting module 1530 in order to supply power. The connection terminal 1520 may be screwed and connected to an external power in the form of a socket. However, there is no limit to the method for connecting the connection terminal 1520 to an external power. For example, the connection terminal 1520 may be made in the form of a pin and inserted into the external power, and/or may be connected to the external power through a power line.

A light emitting device may include: a conductive support member; a first conductive layer disposed on the conductive support member; a second conductive layer disposed on the first conductive layer; an insulation layer disposed between the first conductive layer and the second conductive layer; and a light emitting structure being disposed on the second conductive layer, and including a second semiconductor layer, a first semiconductor layer disposed on the second semiconductor layer, and an active layer disposed between the first semiconductor layer and the second semiconductor layer.

The first conductive layer may include at least one conductive via that penetrates through the second conductive layer, the second semiconductor layer and the active layer, and is disposed in the first semiconductor layer. The insulation layer may be formed to extend to the side wall of the conductive via.

At least one recess (or etching hole) may be formed in the upper portion of the first semiconductor layer. At least a portion of the top surface of the first semiconductor layer and the bottom surface of the recess may have a surface roughness.

A light emitting device package may include: a package body; a first electrode layer and a second electrode layer disposed on the package body; and a light emitting device electrically connected to the first electrode layer and the second electrode layer.

A lighting apparatus may include the light emitting device package.

The light emitting device may further include a reflective layer located between the side wall of the conductive via and the insulation layer formed on the side wall of the conductive via. The reflective layer may include at least one of Ag, Al, Pt, Ni, Pt, Pd, Au, Ir or a transparent conductive oxide, and wherein the transparent conductive oxide includes at least one of ITO and/or GZO. The top surface of the conductive via may have an area greater than that of the bottom surface of the conductive via. The second conductive layer may include at least one exposed area of surface forming an interface with the second semiconductor layer, and wherein the light emitting device may further include an electrode pad formed on the exposed area of the second conductive layer. The electrode pad may be formed in the corner of the light emitting device.

The light emitting device may further include a passivation layer formed on the side wall of the light emitting structure, in order to prevent a leakage current from flowing through the active layer. The insulation layer and the passivation layer are respectively formed including at least one of silicon oxide ($SiO_2$), silicon nitride ($SiOxNy$, $SixNy$), metal oxide ($Al2O3$) or fluoride based compound. The conductive support member may include at least one of Au, Ni, Al, Cu, W, Si, Se or GaAs. The first conductive layer may include at least one of Al, Au, Pt, Ti, Cr or W. The second conductive layer reflects light generated from the active layer. The second conductive layer may include at least one of Ag, Al, Pt, Ni, Pt, Pd, Au, Ir or a transparent conductive oxide, and wherein the transparent conductive oxide includes at least one of ITO and/or GZO. The recess or etching hole is disposed between the conductive vias. The at least a portion of the top surface of the conductive via contacting with the first semiconductor layer has a roughness surface. The distance between the conductive vias may be equal to or larger than 5 μm and equal to or less than 50 μm. The distance from the bottom surface of the first semiconductor layer to the bottom surface of the etching hole may be ½ to ⅔ of a thickness of the first semiconductor layer. The diameter of the bottom surface of the recess or the etching hole may be equal to or larger than 5 μm and equal to or less than 50 μm. The depth of the recess or the etching hole may be ⅓ to ½ of a thickness of the first semiconductor layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
 a conductive support member;
 a first conductive layer on the conductive support member;

a second conductive layer on the first conductive layer;
an insulation layer between the first conductive layer and the second conductive layer;
a light emitting structure that includes a second semiconductor layer on the second conductive layer, a first semiconductor layer, and an active layer between the first semiconductor layer and the second semiconductor layer, the first semiconductor layer having a first surface and a second surface,
wherein the first conductive layer includes at least one conductive via that passes through the second conductive layer, the second semiconductor layer and the active layer, and a first surface of the at least one conductive via is provided into the first semiconductor layer,
wherein the insulation layer substantially surrounds a side wall of the conductive via,
wherein the size of the first surface of the conductive via is smaller than the size of a bottom surface of the conductive via,
wherein the height of the conductive via is higher than or equal to the height of the insulation layer,
wherein the first surface of the first semiconductor layer includes a first surface area, a second surface area and a recess provided between the first surface area and the second surface area, the recess having a bottom surface, wherein the recess is vertically aligned with the second surface of the first semiconductor layer, and the first surface of the at least one conductive via is vertically aligned with the first surface area of the first semiconductor layer, and
wherein the first surface area of the first semiconductor layer has a surface roughness; and
a reflective layer formed between the side wall of the conductive via and the insulation layer, wherein the reflective layer is formed on the inclined surface, and the reflective layer is directly on the insulation layer.

2. The light emitting device of claim 1, wherein a portion of the first surface of the conductive via has a surface roughness.

3. The light emitting device of claim 1, wherein the second conductive layer includes at least one exposed area to form an interface with the second semiconductor layer, and wherein the light emitting device further comprises an electrode pad on the exposed area of the second conductive layer.

4. The light emitting device of claim 1, wherein the reflective layer includes at least one of Ag, Al, Pt, Ni, Pt, Pd, Au, Ir and a transparent conductive oxide, and wherein the transparent conductive oxide includes at least one of ITO and GZO.

5. A light emitting device comprising:
a conductive support member;
a first conductive layer on the conductive support member;
a second conductive layer on the first conductive layer;
an insulation layer between the first conductive layer and the second conductive layer;
a light emitting structure that includes a second semiconductor layer on the second conductive layer, a first semiconductor layer, and an active layer between the first semiconductor layer and the second semiconductor layer, the first semiconductor layer having including a top surface and a bottom surface,
wherein the first conductive layer includes at least one conductive via that extends from a top surface of the first conductive layer and passes through the second conductive layer, the second semiconductor layer and the active layer, wherein the conductive via includes a top surface disposed between the top surface of the first semiconductor layer and the bottom surface of the first semiconductor layer,
wherein the insulation layer substantially surrounds a side wall of the conductive via,
wherein a size of the top surface of the conductive via is smaller than a size of a bottom surface of the conductive via,
wherein a height of the conductive via is higher than or equal to a height of the insulation layer,
wherein the top surface of the first semiconductor layer has at least one recess having a bottom surface, wherein the top surface of the at least one conductive via is vertically aligned with the top surface of the first semiconductor layer,
wherein the bottom surface of the recess is vertically aligned with the bottom surface of the first semiconductor layer,
wherein the top surface of the first semiconductor layer has a surface roughness, and wherein the bottom surface of the recess has a surface roughness.

6. The light emitting device of claim 5, wherein the second conductive layer includes at least one exposed area to form an interface with the second semiconductor layer, and wherein the light emitting device further includes an electrode pad on the exposed area of the second conductive layer.

7. The light emitting device of claim 5, further comprising a passivation layer formed on a side wall of the light emitting structure, the passivation layer to prevent a leakage of current.

8. The light emitting device of claim 7, wherein the insulation layer and the passivation layer are respectively formed to include at least one of silicon oxide ($SiO_2$), silicon nitride ($SiO_xN_y$, $Si_xN_y$), metal oxide ($Al_2O_3$) or fluoride based compound.

9. The light emitting device of claim 5, wherein a portion of the top surface of the conductive via has a surface roughness.

10. The light emitting device of claim 5, wherein the conductive support member includes at least one of Au, Ni, Al, Cu, W, Si, Se or GaAs.

11. The light emitting device of claim 5, wherein the first conductive layer includes at least one of Al, Au, Pt, Ti, Cr or W.

12. The light emitting device of claim 5, wherein the second conductive layer reflects light from the active layer.

13. The light emitting device of claim 5, wherein the second conductive layer includes at least one of Ag, Al, Pt, Ni, Pt, Pd, Au, Ir and a transparent conductive oxide, and wherein the transparent conductive oxide includes at least one of ITO and GZO.

14. The light emitting device of claim 5, wherein the conductive via includes a first conductive via and a second conductive via, and wherein a distance between the first conductive via and the second conductive via is 5 μm to 50 μm.

15. The light emitting device of claim 5, wherein a distance from the bottom surface of the first semiconductor layer to the bottom surface of the recess is ½ to ⅔ of a thickness of the first semiconductor layer.

16. The light emitting device of claim 5, wherein a diameter of the bottom surface of the recess is 5 μm to 50 μm.

17. The light emitting device of claim 5, wherein a depth of the recess is ⅓ to ½ of a thickness of the first semiconductor layer.

* * * * *